United States Patent

[11] 3,603,970

[72] Inventors Christopher E. G. Bailey
Cranleigh;
Reginald Catherall, Farnborough, both of, England
[21] Appl. No. 741,538
[22] Filed July 1, 1968
[45] Patented Sept. 7, 1971
[73] Assignee The Solartron Electronic Group Limited
Farnborough, Hampshire, England
[32] Priority July 19, 1967
[33] Great Britain
[31] 33126/67

[54] SUCCESSIVE APPROXIMATION ANALOG-TO-DIGITAL CONVERTERS
5 Claims, 3 Drawing Figs.

[52] U.S. Cl. .................................................. 340/347 AD
[51] Int. Cl. .................................................. H03k 13/06
[50] Field of Search .................................................. 340/347

[56] References Cited

UNITED STATES PATENTS

| | | | |
|---|---|---|---|
| 3,188,455 | 6/1965 | Quick, Sr. | 235/183 |
| 3,255,446 | 6/1966 | Emmerich | 340/347 |
| 3,296,613 | 1/1967 | Andersen et al. | 340/347 |
| 3,384,889 | 5/1968 | Lucas | 340/347 |
| 3,483,550 | 12/1969 | Max | 340/347 |

*Primary Examiner*—Maynard R. Wilbur
*Assistant Examiner*—Michael K. Wolensky
*Attorneys*—William R. Sherman, Stewart F. Moore, Jerry M. Presson and Roylance, Abrams, Berdo & Kaul

ABSTRACT: The range and discrimination of known successive approximation analog-to-digital converters have to be restricted undesirably in order to avoid digital errors of one or several bits in the readings. The invention avoids this problem by using a second, small range analog-to-digital converter to measure the residual analog error of the main converter when the latter has settled. The digital value provided by the second converter is preferably automatically added to (or subtracted from) the digital indication provided by the main converter.

INVENTORS
Christopher E.G. Bailey
Reginald Catherall
ATTORNEY

SUCCESSIVE APPROXIMATION ANALOG-TO-DIGITAL CONVERTERS

This invention relates to successive approximation analog-to-digital converters, (ADC's). Such converters are well known (see for example "Computer Handbook" Huskey & Korn, 1962 pp. 18.32 to 18–34) and are commonly used as digital voltmeters. The input signal (voltage or current) is compared with a comparison signal made up of the sum of selected ones of a succession of decreasing standard signals. If the selection of a standard signal causes the comparison signal to exceed the input signal, the standard signal is rejected; otherwise it is retained in the comparison signal. In either event the next standard signal is tested and the procedure continues until the least significant standard signal (one bit) has been tested. The comparison signal then equals the input signal to within one bit and a digital measure of the input signal is provided by those standard signals which have been selected.

It is known that it is not possible for such an ADC to have a large range and high discrimination. High discrimination implies an amplifier in the comparison circuitry of high gain, and adequate bandwidth must be available to give a reasonable speed of operation. The application of a large standard signal thus overloads the amplifier which overshoots. If the input signal is just in excess of this large standard signal, the comparison circuitry may nevertheless reject the standard signal because of the overshoot. This makes it impossible to achieve a meaningful reading.

Quite apart from this special problem, if range and discrimination are both increased, the point is reached at which it is not merely practically impossible but it is theoretically impossible to ensure that discrimination always takes place to within one bit. In other words it is not possible to ensure that the last-added standard signal is retained if the comparison signal is less than the input signal by only one bit and is rejected if the comparison signal exceeds the input signal by only one bit. In the past the necessary result of these problems has been an undesirable restriction on the usable range and discrimination of such ADC's. The object of this invention is to overcome the problems.

According to the present invention there is provided a successive approximation ADC having an output at which appears a signal equaling the difference between the input signal and the comparison signal and having a small capacity, second ADC connected to the said output by means enabling the second ADC to become operative when the main ADC has settled, the second ADC, when operative, providing a ramp signal which is fed back to the main ADC to reduce the difference signal substantially to zero, whereupon the second ADC ceases to operate, the second ADC comprising means for providing a digital output indicating the number of bits represented by the ramp signal. The ramp signal may have a staircase or linear waveform.

Thus the fact that the output of the main ADC may contain errors in excess of one bit is accepted and a supplementary correction is effected by the ADC. Because the amplifier overload error invariably results in readings overshooting the error which are always of the same sign, the second ADC only has to deal with signals of one polarity. Preferably the operation of the second ADC follows automatically and promptly upon the operation of the main ADC. This is readily achieved by arranging for the logic circuits of the main ADC to switch the second ADC into operation when the least significant standard signal of the main ADC has been tested.

The second ADC can display its digital output separately as a correcting factor to the reading of the main ADC but preferably the circuits of the two ADC's are so interconnected that the digital output of the second ADC is transferred to the digital circuits of the main ADC so as to modify directly the number held therein.

The second ADC can be simple and inexpensive. Only a few bits capacity is required and overall accuracy need not be high since this ADC only contributes a small correction. In one simple form the second ADC comprises a pulse generator which runs only so long as the said difference signal exceeds one bit and a capacitor charged by the pulses to generate a staircase ramp.

It may be advantageous to make the threshold of the main ADC more than one bit in order to avoid improper rejection of standard signals. In some cases then the main ADC will indicate correctly; in other, an unbalance signal of magnitude intermediate one bit and the threshold will remain. This unbalance signal will be dealt with by the second ADC.

Although the time taken for the second ADC to operate is added to that taken by the main ADC, the present invention enables the operation of the main ADC to be speeded sufficiently (for a given range and resolution) to achieve an overall saving of time.

One embodiment of the invention will now be described by way of example with reference to the accompanying drawings of the provisional specification, in which.

Figure 1:
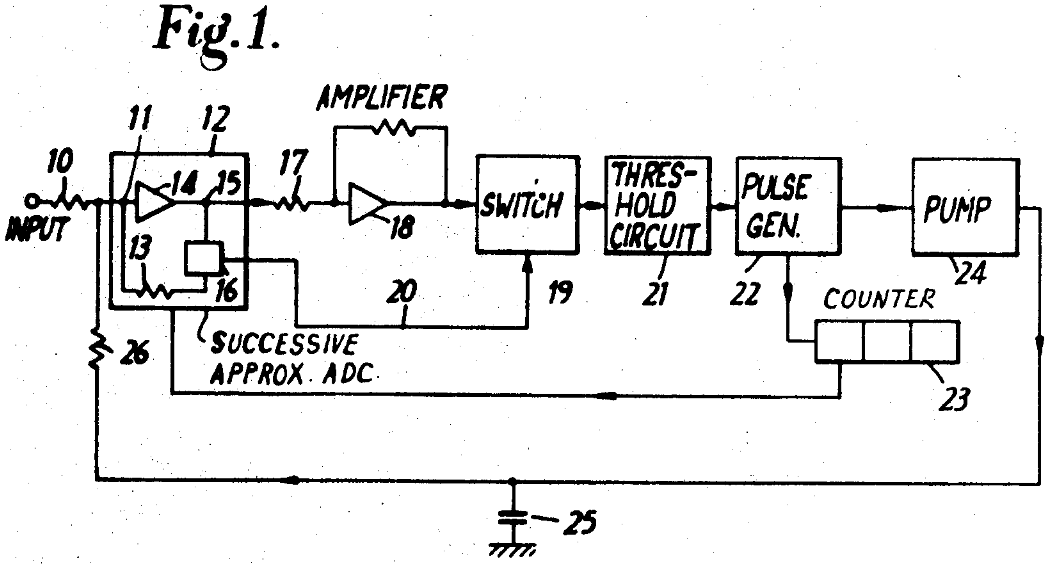
FIG. 1 is a block circuit diagram.

In FIG. 1 an input voltage is applied through a resistor 10 to the summing junction 11 of a main, successive approximation ADC 12 of conventional form. The comparison signal is fed back to the junction 11, the network performing this being symbolized by a resistor 13. The summing junction is connected to a comparison amplifier 14 at whose output 15 appears a difference voltage. This voltage controls the logic circuits 16 which control the switching of the standard currents making up the comparison signal. Fuller details are available in Huskey & Korn, loc. cit.

For the purposes of the present invention the output terminal 15 is also connected through a resistor 17 and feedback amplifier 18 to a switch 19. The amplifier can have a small gain, say X 100 in voltage with a lowering of impedance. The amplifier can thus be simple and constructed so as to have no significant overload phenomena. When the ADC 12 has completed its sequence of operations it applies a signal via line 20 to open the switch 19. This signal is readily derived from the logic circuits of the ADC. When the switch 19 opens, the difference voltage, as amplified by the amplifier 18, is applied to a threshold circuit 21 which assumes one state when the amplifier voltage exceeds one bit and the other state when the amplifier voltage is less than on bit. The circuit 21 switches on a clock pulse generator 22 only when the circuit 21 is in its said one state.

The pulses from the generator 22 are counted by a counter 23 and are also applied to a pump circuit 24 which feeds a standard unit of charge to a capacitor 25 in response to each pulse. The voltage on the capacitor therefore builds up as a staircase ramp waveform whose steps are arranged to be of a magnitude of one bit. This voltage feeds current to the summing junction 11 through a resistor 26 so as to reduce the difference voltage to less than one bit. Thereupon the circuit 21 switches to its other state, the pulse generator 22 stops and the number in the counter 23 is a digital measure of the correction to be applied to the count registered by the ADC 12.

Figure 2:
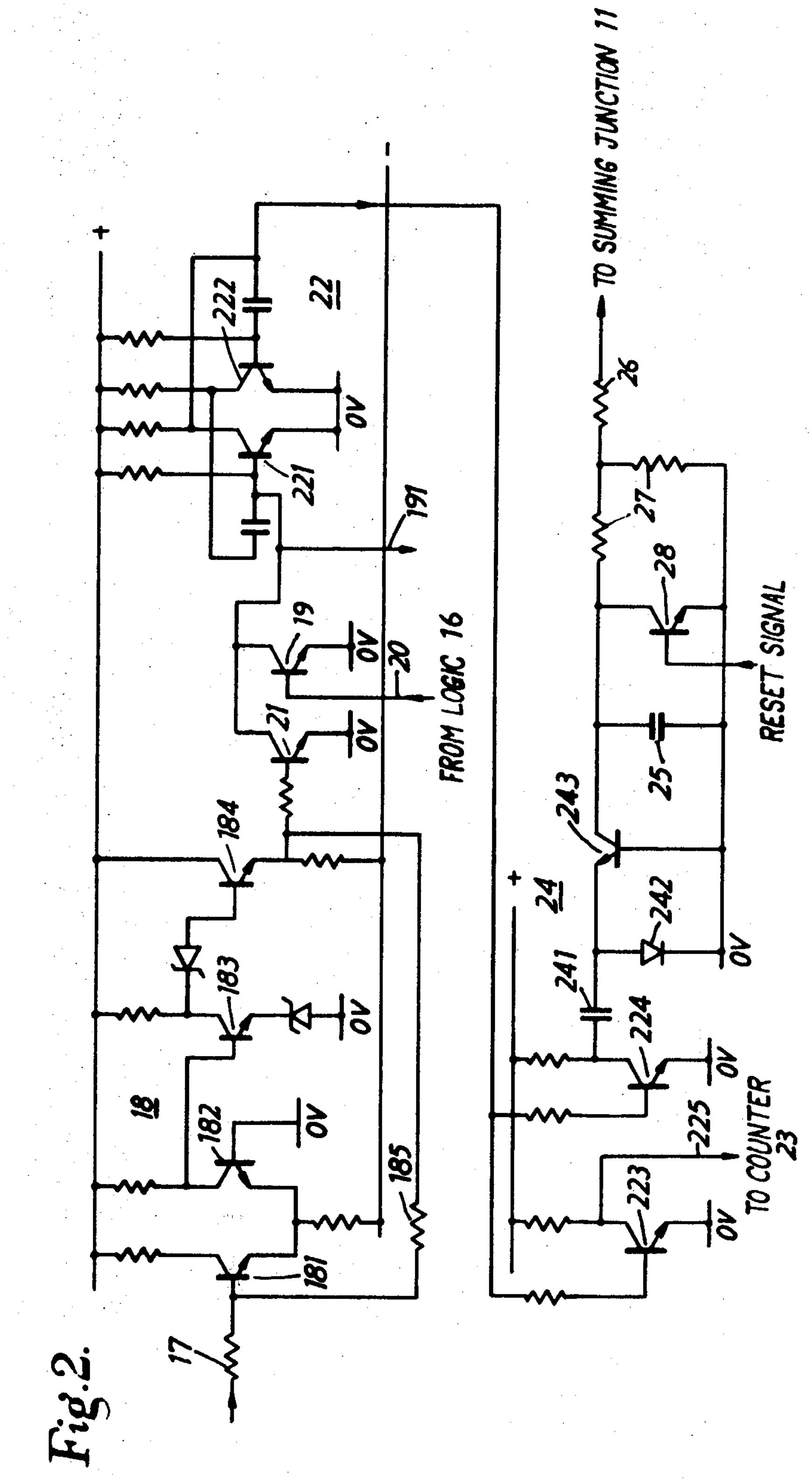
FIG. 2 shows circuit details of the second ADC.

FIG. 2 shows the circuit from the resistor 17 to the resistors 26 in more detail. The amplifier 18 comprises a differential amplifier including transistors 181, 182 followed first by a grounded emitter stage 183 and then a grounded collector stage 184. Overall feedback is applied over a resistor 185. The threshold circuit 21 consists merely of a grounded emitter transistor resistance coupled to the amplifier. When the amplifier output is positive, the collector of the transistor is clamped to ground. When the amplifier output is negative, the collector does not draw current. The switch 19 is a similar grounded emitter stage which clamps the collector of the transistor 21 to ground in the absence of the signal from the logic circuits 16.

The pulse generator consists of a multivibrator formed by two transistors 221 and 222. The multivibrator is disabled when the base of the transistor 221 is clamped to ground by conduction either of transistor 19 or 21. The multivibrator drives two buffer stages 223 and 224 in parallel. The stage 223 supplies pulses on line 225 to the counter 23. The stage 224 drives the pump circuit 24 which consists of a series capacitor 241, a diode 242 and a grounded base transistor 243. Positive pulses passed by the capacitor are shunted to ground by the diode. Negative pulses pass to the emitter of the transistor 243. The average current due to these pulses reappears substantially unaltered in value but at high impedance in the collector circuit and charges the capacitor 25. The voltage across this is attenuated by a voltage divider 27 whose tap is connected through the feedback resistor 26 to the summing junction 11. After each measurement the capacitor 25 is discharged by turning on a transistor 28 thereacross, using for this purpose the reset signal available from the ADC 12.

Figure 3:
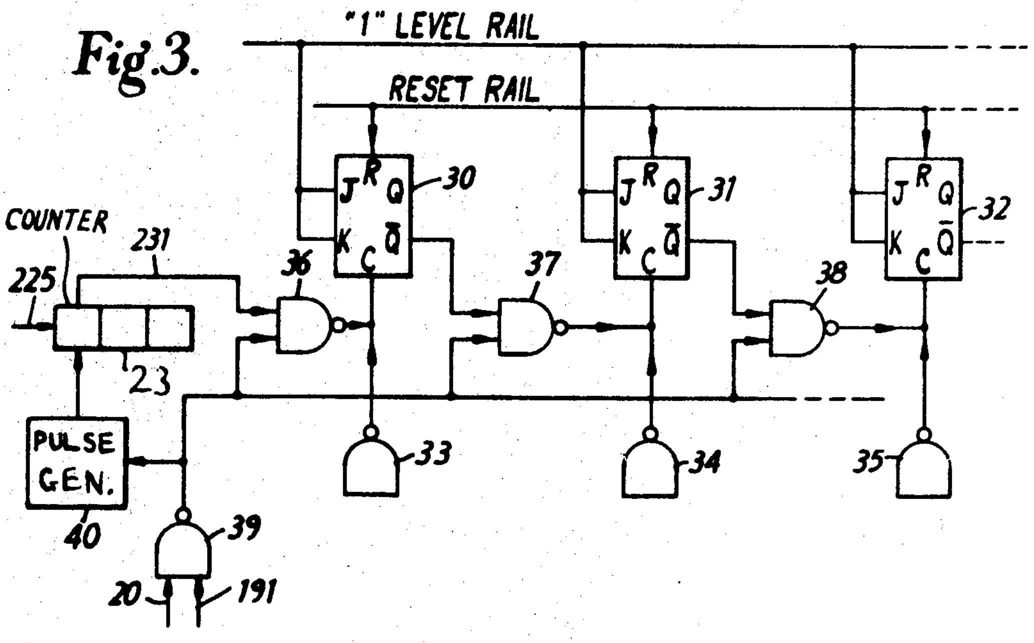
FIG. 3 shows how the digital output of the second ADC is transferred to the main ADC.

FIG. 3 shows one possible arrangement for adding the number in the counter 23 to that registered by the ADC 12. The ADC contains, as is conventional, a flip-flop (bistable) registers of which the three least significant stages 30, 31 and 32 are shown in FIG. 3 using conventional notation. The flip-flops are JK flip-flops with complementary outputs Q and $\bar{Q}$ and inputs J, K, C, R and S of which the input S is not used here and therefore is not illustrated. When $R = C = 0$ the state of the flip-flop persists. When $R$=1, $C$=1, $C$=0 the flip-flop sets to $Q$=0, $Q$=0, $\bar{Q}$=1 and when $R$=0, $C$=1 it sets to $Q$=1, $\bar{Q}$=0. The values of J and K are without effect when $C$=1, and also when $C$=$J$=$K$1 the state is switched. Here all J and K inputs are permanently connected to the logic 1 level.

Gates 33, 34 and 35 are connected to the C inputs of the flip-flops 30, 31 and 32 respectively. These gates function in known manner during the operation of the ADC 12 to set the flip-flops to represent the digital output of the ADC. Each flip-flop is set independently in accordance with whether its corresponding standard signal is retained or rejected.

However, for the purposes of the present invention the flip-flops are subsequently interconnected to propagate carries and the number held in the counter 23 is pulsed into the least significant flip-flop 30. To this end further NAND gates 36, 37, 38 are connected to the C inputs of the flip-flops and these gates are enabled by a signal from a gate 39 when the signal on line 20 (FIG. 2) indicates that the second ADC is to be operative and the signal on line 191 (FIG. 2) from the transistor 19 indicates that the pulse generator 22 is to stop (i.e. the difference signal has been reduced substantially to zero and the corrective count is held in the counter 23).

The output from gate 39 also enables a pulse generator 40 which pulses the counter 23 back to zero. The counter 23 emits pulses as this is done, one for each count down, on a line 231 and these pulses are applied to the other input of the gate 36. The other inputs of gates 37, 38 etc. are connected to the $\bar{Q}$ outputs of the preceding flip-flops 30, 31 etc.

In a typical application the counter 23 need only have a capacity of 3 bits, enabling up to 8 pulses to be counted.

While there has been described what is at present considered to be one embodiment of this invention, it will be obvious to those skilled in the art that various changes and modifications may be made in the instrument without departing from the invention, and it is, therefor, intended to cover all such changes and modifications as fall within the true spirit and scope of the invention. For example the invention can be used to deal with any transient errors, since errors other than overshoot, such as undershoot and errors caused by inductive resistors, can all be transformed to overshoot errors by applying a small analog offset signal to increase the input signal during the first part only of the measuring interval.

What is claimed is:

1. In combination, a successive approximation analog-to-digital converter including, means for generating a comparison signal through the process of successive approximation, comparison means for comparing the value of the generated comparison signal with the value of a received input signal and providing a difference signal representing a difference in value therebetween, logic means responsive to the difference signal to control the comparison signal generating means until said process of successive approximation is completed; a second analog-to-digital converted coupled to said comparison means, start means controlled by said logic means for rendering the second analog-to-digital converter operative to generate a time-varying signal when said process of successive approximation is completed, means for feeding back the time-varying signal to said comparison means so as to reduce the value of the difference signal, and means for terminating the feeding back of the time-varying signal when the difference signal is reduced to a predetermined value.

2. The combination as claimed in claim 1, wherein the time-varying signal is a ramp voltage.

3. The combination as claimed in claim 1, which further comprises, register means coupled to said logic means for providing a first digital representation of the value of said input signal as determined by said process of successive approximation, said second analog-to-digital converter providing a second digital representation of the time-varying signal and which further comprises, means for applying the second digital representation to said register means to modify said first digital representation so as to account for said time-varying signal.

4. The combination as claimed in claim 1, wherein the second analog-to-digital converter includes a source of pulses, and means coupled to said source for storing pulses received therefrom from the operation of the start means until the operation of the terminating means.

5. In combination, a successive approximation analog-to-digital converter comprising, means for generating by the process of successive approximation a comparison signal, comparison means for receiving and comparing the comparison signal and an input signal under measurement and providing a difference signal representative of the difference in magnitude therebetween, logic means responsive to the difference signal to control the comparison signal generating means until the successive approximation process is completed, a register coupled to said logic means for providing a digital representation of the magnitude of the successively approximated input signal; a second analog-to-digital converter coupled to receive difference signals from the comparison means, start means responsive to the logic means for initiating the operation of the second analog-to-digital converter when the said successive approximation process is completed, the second analog-to-digital including means for generating pulses and a ramp signal proportional to the number of pulses generated, means for feeding back the ramp signal to the said comparison means for reducing the magnitude of said difference signal to a predetermined value, means for terminating the ramp signal when said difference signal is reduced to said predetermined digital value, and means for applying pulses to said register in accordance with said generated pulses to correspondingly change the digital output thereof.